United States Patent [19]

Ma

[11] 4,352,209
[45] Sep. 28, 1982

[54] UP-DOWN FREQUENCY CONVERTER FOR CABLE T.V.

[76] Inventor: John Ma, 3622 Winnetka Rd., Glenview, Ill. 60025

[21] Appl. No.: 242,908

[22] Filed: Mar. 23, 1981

[51] Int. Cl.³ ............................................. H04B 1/26
[52] U.S. Cl. ................................... 455/315; 455/189; 455/301
[58] Field of Search .............................. 455/314–317, 455/189, 190, 300, 301, 327, 328

[56]  References Cited
U.S. PATENT DOCUMENTS

| 3,226,645 | 12/1965 | Harwood et al. | 455/316 |
| 3,309,613 | 3/1967 | Bell | 455/301 |
| 3,742,131 | 6/1973 | Rogeness | 455/190 |
| 4,214,212 | 7/1980 | Dipietromaria | 455/190 |

Primary Examiner—Marc E. Bookbinder

[57] ABSTRACT

A cable television up-down tuner includes a first frequency up conversion stage in which a first local oscillator, tunable over a wide frequency range, is coupled to a ring diode mixer having individual biasing networks in series with each diode. A combination high pass and low pass filter provides a bandwidth coupling of input signals to the mixer. An intermediate frequency amplifier couples the up converted signal to a second mixer. A fixed tuned second local oscillator down converts the intermediate frequency signal to a selected television channel frequency. The first local oscillator includes a printed circuit board transmission line resonator which is tuned by a varactor diode. The two local oscillators are positioned adjacent the corners of a quadrilateral housing and are isolated from each other by three wall-type shields.

5 Claims, 4 Drawing Figures

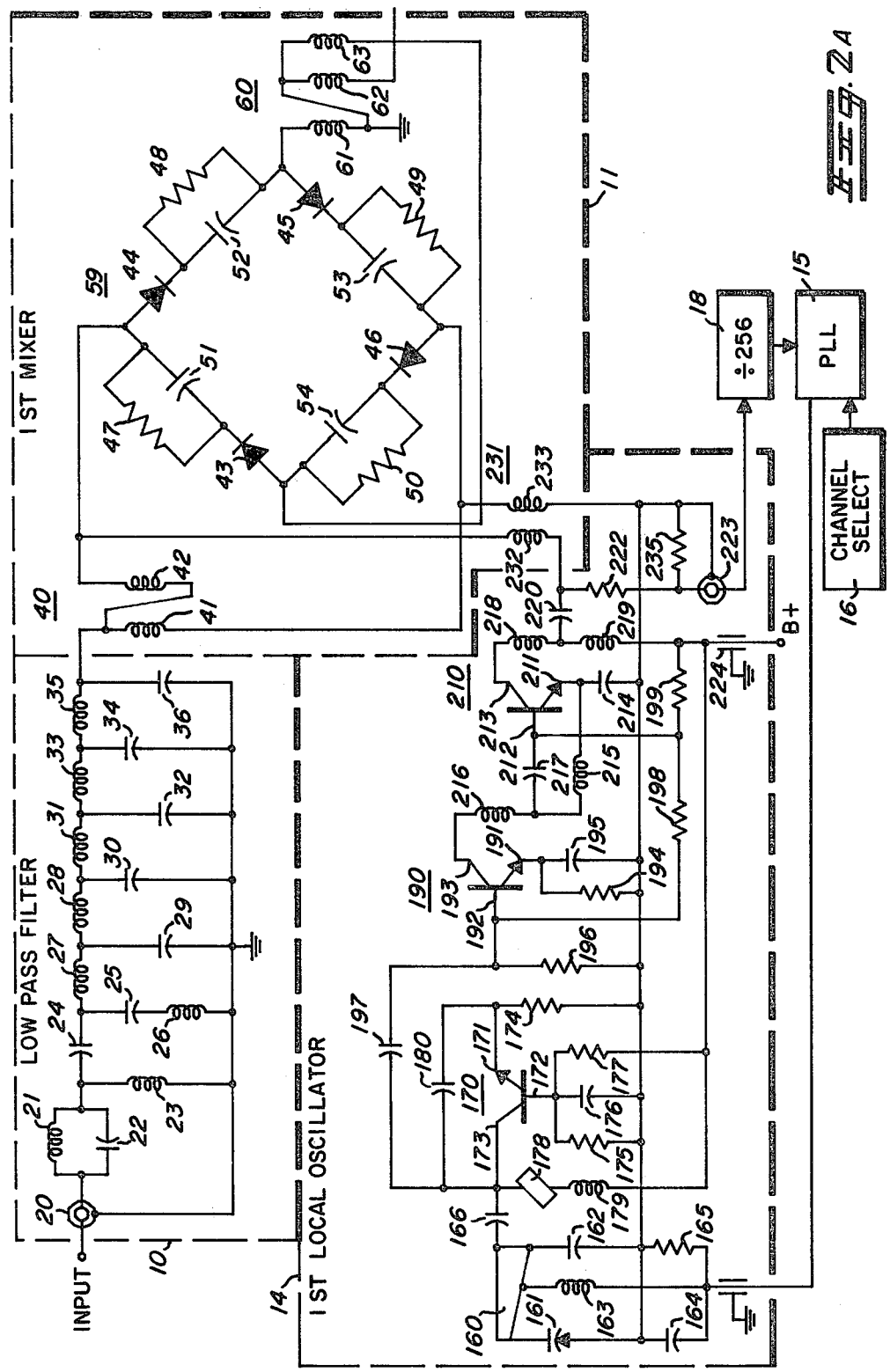

UP-DOWN FREQUENCY CONVERTER FOR CABLE T.V.

BACKGROUND OF THE INVENTION

This invention relates generally to cable television tuning systems. It relates more particularly to up-down frequency converters for use in cable television systems.

Cable television systems typically comprise a central master source of television programming information which imparts a program or group of programs at different assigned frequencies to a network of cable connections which, through various distribution and selection network components, ultimately terminate in a branched out plurality of user terminals typically in residences or commercial establishments. Particularly in great metropolitan areas cable systems may comprise one or more master sources which are patched into a common distribution system. In the typical cable television environment television signals are simultaneously broadcast over different assigned carrier frequencies normally from 50 to 450 megahertz. An increasingly popular aspect of cable television environment is the commercial development known most popularly as subscription television systems. Such systems are functionally similar to publicly available cable television environment with the exception that an added feature within the distribution system provides for scrambling the television signals at some point in the distribution system prior to the user terminal in combination with a mechanism at the user terminal by which a user upon becoming a subscriber may then be provided with an operative signal.

While there are several types of subscription television systems operating both over the air and through cable, they all share the common elements of several known systems. In one such system the signal broadcast or imparted to the cable system is "scrambled" by some preferred method, is received at the subscriber in a scrambled condition, and is processed by an "unscrambler" device which is interposed between the signal input and the subscriber's television receiver. In another known system the signal itself is transmitted in a normal fashion but selectively impaired by individually controllable transmission devices interposed within the distribution system. In this latter system the subscriber is provided with an operative signal in response to a transmission command within the inaccessible distribution system.

The signal processing systems and sub-systems operating within a cable television distribution network function under a number of varying and demanding conditions. For example the great number of television channels which are simultaneously broadcast over the system means that the signal processing devices of the system must be able to process a wide range of frequency signals. In addition, a number of sources of possible interfering signals from non-cable broadcast media often at the same or very proximate signal frequencies as those being carried by the cable system can increase the chances of interference.

As mentioned above, the broad range of signals simultaneously broadcast over cable systems is typically from 50 to 450 megahertz. A television tuner capable of directly processing signals in the range of 50 to 450 megahertz would be difficult if not impractical to provide especially since the problems of cross-modulation and intermodulation would be great. Accordingly, practitioners in the art employ what has become to be known as an up-down tuner system. The operation of an up-down tuner forms a very important portion of the present invention and will be explained in greater detail below. The operation of an up-down converter may be understood to be the utilization of an initial frequency conversion stage which frequency up converts the incoming selected signal to an intermediate frequency signal of a frequency higher than the highest received signal, that is, above 450 megahertz. This high frequency IF signal is then frequency down converted by a second frequency converter stage to a selected commercially utilized television broadcast signal frequency. Most typically the selected broadcast signal frequency corresponds to one of the lower VHF channels not in use in the cable locale.

Such frequency conversion devices generally form a portion of a total television system as for example in cable or subscription television distribution systems. When so used, it is advantageous because of the construction of such signal processing systems permits separate packaging the cable television up-down converter. That is, a single sub-system unit may be provided to which the incoming signals are applied and within which the frequency up-down conversion takes place. There is also an overriding aspect of such system design to provide for isolation between the input and output signals and first and second local oscillators signal frequency to avoid the generation of undesired interferring signals and signal products. Optimum package design in order to assure that the cable television up-down tuner most advantageously adapts to the remainder of the distribution network requires that the overall package size be maintained as small as possible. Further, it is advantageous to have both the input and output cable connections on the same facet of the panel face to provide ease of tuner installation within the remainder of the distribution device.

Unfortunately, however, several of these desirable qualities are somewhat hostile to each other. For example it has been found that maintaining a small package size with input and output connections on the same side necessarily brings input and output terminals closer together and thus increases the possibility of interference. Each reduction of package size necessarily reduces interior spacing of components within the unit and also increases the likelihood of internal feedback problems within the unit. These difficulties are further increased with greater signal amplitude and higher magnitude of gain for the up-down converter itself. In view of the steady requirement trend toward size reduction of cable television distribution components, these remains a need in the art for an up-down converter which may be packaged as a small unit with input and output terminals located on the same cabinet face while still being capable of handling high amplitude signals and having sufficiently high gain to be compatible with the remainder of the system.

SUMMARY OF THE INVENTION

Accordingly, it is an object of the present invention to provide an improved up-down frequency converter.

It is a more particular object of the present invention to provide an improved performance, compact and easy to produce up-down frequency converter.

A cable television up-down frequency converter includes a pair of printed circuit modules spaced apart by a central pair of oppositely grounded double tuned cavities. The input and output terminals of the converter occupy the extremes of a common enclosure and a plurality of interior partitions create a plurality of interior cavities permitting a back and forth signal path which provides enhanced performance but minimizes the total unit size.

BRIEF DESCRIPTION OF THE DRAWINGS

The features of the present invention which are believed to be novel are set forth with particularity in the appended claims. The invention, together with further objects and advantages thereof, may best be understood by reference to the following description taken in connection with the accompanying drawings, in the several figures of which like reference numerals identify like elements, and in which:

FIGS. 2A and 2B are a partial electrical schematic and block diagram of the up-down frequency converter of the present invention.

DESCRIPTION OF THE PREFERRED EMBODIMENT

Figure 1:
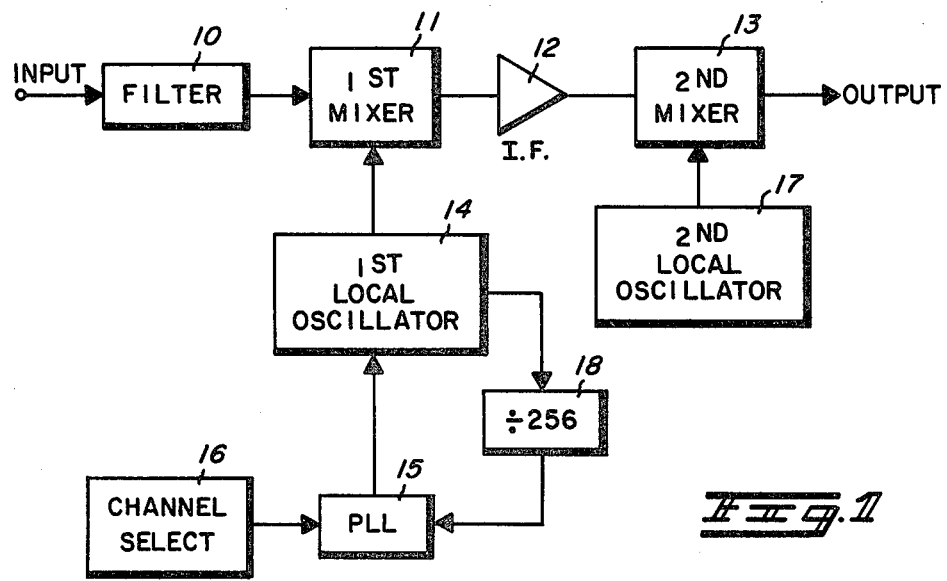
FIG. 1 is a functional block diagram of the up-down frequency converter of the present invention.

FIG. 1 shows a functional block diagram of a cable television up-down tuner constructed in accordance with the present invention. An input filter 10 has a signal terminal receiving the input signal and an output coupled to the one input of a first mixer 11. The output of mixer 11 is coupled to an intermediate frequency amplifier 12, the output of which is coupled to one input of a second mixer 13. A first local oscillator 14 is coupled to the remaining input of mixer 11. A phase locked loop 15 is coupled to and operative upon first local oscillator 14 and a channel select 16 is coupled to phase locked loop 15. A second local oscillator 17 is coupled to the remaining input input of second mixer 13 while the output of second mixer 13 is coupled to the remainder of the cable television system. A frequency divider 18 is interposed between phase locked loop 15 and first local oscillator 14.

In operation an input signal having a frequency in the range of from 50 to 450 megahertz is frequency selected by a combination of filter elements within filter 10 and supplied as one input to first mixer 11. Channel select 16 generally adjusts the frequency of first local oscillator 14 to provide the appropriate local oscillator signal to mixer 11 whereby the selected one of the many frequency signals passing through filter 10 is frequency up converted by mixer 11 to the intermediate frequency of IF amplifier 12. The selected intermediate frequency signal for IF amplifier 12 is approximately 611 megahertz. There is always less than the first IF frequency hence the designation up-down tuner. In the preferred embodiment, channel select 16 adjusts the frequency of first local oscillator 14 such that the high frequency mixer product between the output signal of the local oscillator 14 and the to be selected signal becomes 611 megahertz. The frequency selective networks within IF amplifier 12 are sufficiently narrow to pass only those signal components which are within a predetermined range of frequencies narrowly clustered about the 611 megahertz intermediate frequency carrier. As a result, the output signal of intermediate frequency amplifier 12 which is applied to second mixer stage 13 is a single television channel which has been up converted to 611 megahertz.

Second local oscillator 17, a fixed frequency oscillator, supplies the oscillator injection signal for second mixer 13. Unlike first local oscillator 14 which is "tunable", second local oscillator 17 is maintained at a constant or fixed frequency by a reference network which may comprise any of the well known methods such as a tuned circuit, a resonant crystal element or a single frequency phase locked loop. The fixed single frequency of second local oscillator 17 is selected to be that frequency which will heterodyne or frequency convert the 611 megahertz intermediate frequency signal down to a selected television broadcast signal. While most any television broadcast signal could be utilized, the frequency of second local oscillator 17 is typically selected to produce a frequency down conversion in second mixer 13 such that the output signal corresponds to a low VHF broadcast frequency preferably channels 2, 3 or 4.

Figure 2B:
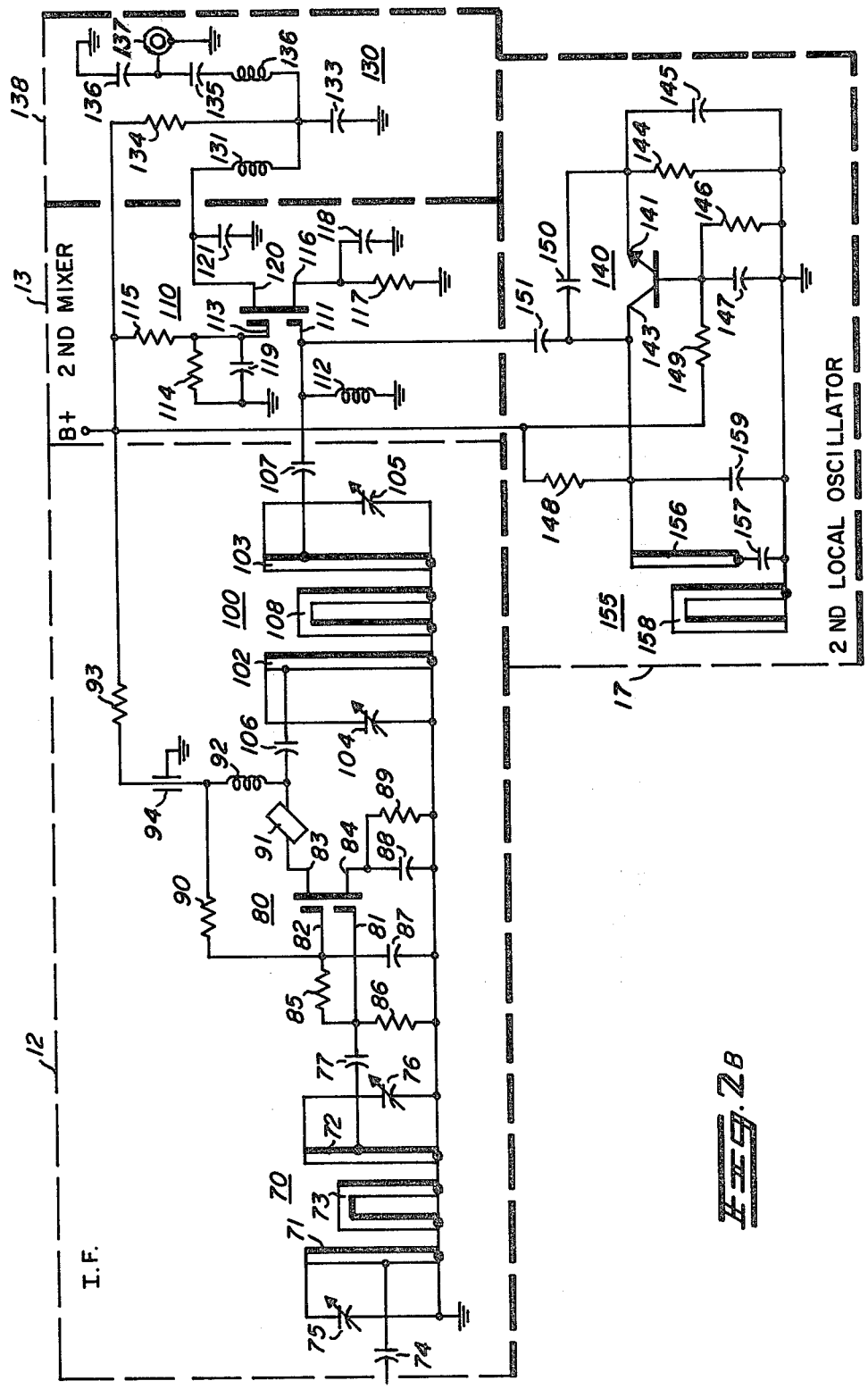

FIG. 2 shows an electrical schematic of the up-down tuner of the present invention in which the broken line enclosures separate the various elements depicted as block diagram entities in FIG. 1. Because the construction of phase locked loop 15 may comprise any of the well known phase locked loop structures within the art, its detailed structure is not relevant to the present invention up-down tuner. Frequency divider 18 permits any of several PLL IC's to be utilized such as MM55108 manufactured by National Semiconductor. Accordingly, phase locked loop 15 remains in its block diagram representation in FIG. 2. Similarly divide by 256 counter or prescaler 8 may be comprised of any of several seven stage binary counters and channel select 16 may be comprised of a key board or counter imparting digital information to the PLL IC to provide the desired frequency.

A shielded input signal connector 20 is coupled to a parallel combination of an inductor 21 in a capacitor 22, the other end of which is coupled to ground through an inductor. The junction of inductors 23 and 21 and capacitor 22 is coupled to the first terminal of a capacitor 24, whose second terminal is coupled to ground by a series combination of a capacitor 25 and an inductor 26. The second terminal of capacitor 24 is connected to a series arrangement of inductors 27 and 28. The junction of inductors 27 and 28 is connected to ground by a capacitor 29. Inductor 28 and to an inductor 31 is coupled to ground by a capacitor 30. Inductor 31 is coupled to ground by a capacitor 32 and to an inductor 33. Inductor 33 is coupled to ground by a capacitor 34 and to an inductor 35. The remaining end of inductor 35 is coupled to ground by a capacitor 36. First mixer 11 is shown to include a transformer 40.

Transformer 40 includes a primary winding 41 having one end coupled to the junction of inductor 35 and capacitor 36 and a secondary winding 42 having one end also connected to the junction of inductor 35 and capacitor 36. First mixer 11 also includes a bridge arrangement comprising diodes 43, 44, 45 and 46, resistors 47, 48, 49 and 50 and capacitors 51, 52, 53 and 54. A diode ring mixer 59 comprises diode 43 having a cathode electrode coupled via the parallel combination of resistor 47 and capacitor 51 to the anode electrode of diode 44. Diode 44 has its cathode electrode connected to one end of a parallel combination of resistor 48 and capacitor 52. Diode 45 has its anode electrode connected to the remaining end of the parallel combination of capacitor 52 and resistor 48 and a cathode electrode connected to a parallel combination of resistor 49 in capacitor 53. Diode 46 has an anode electrode connected to the remaining end of the parallel combination of capacitor 53 and resistor 49 and a cathode electrode connected to a parallel combination of capacitor 54 and resistor 50. The remaining end of the parallel combination of capacitor 54 and resistor 50 is connected to the anode of diode 43 completing the ring structure of mixer 59. The remaining end of primary winding 42 is connected to the anode of diode 44 and the remaining end of primary winding 41 is connected to the anode of diode 46.

A transformer 60 has a primary winding 61 coupled between the anode of diode 45 and ground. A pair of secondary windings 62 and 63 are also connected to ground. A bandpass interstage circuit 70 includes a pair of resonant elements 71 and 72 each having one end connected to ground and a loop element 73 connected to ground and being movable in relation to elements 71 and 72. A capacitor 74 is coupled between one end of secondary winding 62 and a selected point along the length of resonant element 71. A tunable capacitor 75 is connected between the ungrounded end of resonant element 71 and ground. A tunable capacitor 76 is connected between the ungrounded end of resonant element 72 and ground. A capacitor 77 has one end coupled to a predetermined point on resonant element 72. The remaining end of primary winding 63 is connected to the anode of diode 43.

A dual gate field effect transistor 80 has first and second gate electrodes 81 and 82, a drain electrode 83 and a source electrode 84. Capacitor 77 is coupled between a predetermined point on resonant element 72 and gate electrode 81. Second gate electrode 82 is coupled to first gate electrode by a resistor 85. First gate electrode 81 is coupled to ground by a resistor 86 and a capacitor 87 is coupled between ground and gate electrode 82. Source electrode 84 is coupled to ground by the parallel combination of a capacitor 88 and a resistor 89 and drain electrode 83 is coupled to a source of operating or battery potential by the series combination of an inductor 92 and a resistor 93 through a conductor surrounded by a ferrite bead 91 to damp very high frequency oscillations. Parasitic or feed-through capacitor 94 connected to ground is coupled between the inner connection of inductor 92 and resistor 93.

A bandpass interstage circuit 100 includes a pair of resonant elements 102 and 103 each having one end connected to ground. A pair of tunable capacitors 104 and 105 are coupled between the ungrounded ends of elements 102 and 103 respectively and ground. A coupling capacitor 106 is coupled between drain electrode 83 and a preselected point along resonant element 102 and one end of a coupling capacitor 107 is connected to a preselected point along resonant element 103. Bandpass circuit 100 also includes a loop element 108 having one end connected to ground and movable in proximity to resonant elements 103 and 102.

A dual gate field effect transistor 110 has a first gate electrode 111 coupled to resonant element 103 through capacitor 107 and to ground by an inductor 112, and a second gate electrode 113 coupled to ground by a resistor 114 and to a source of operating potential by a resistor 115. A source electrode 116 is coupled to ground by a parallel combination of a resistor 117 and a capacitor 118. A capacitor 119 is coupled between gate electrode 113 and ground. A drain electrode 120 is connected through a primary tuning capacitor 121 to ground.

An output transformer 130 includes a primary winding 131 and a secondary winding 132 commonly connected to ground by a capacitor 133. The junction of windings 131 and 133 is connected to a source of operating potential by a resistor 134. Primary tuning capacitor 121 is connected between the remaining ends of winding 131 and ground while winding 131 is connected to drain electrode 120. The remaining end of winding 132 is connected to ground by a series combination of a capacitor 135 and a capacitor 136. The junction of capacitors 135 and 136 is connected to a shielded output terminal 137.

A transistor 140 has an emitter electrode 141, a base electrode 142 and a collector electrode 143. Transistor 140 has its emitter electrode 141 coupled to ground by a parallel combination of a resistor 144 and a capacitor 145. Base electrode 142 is coupled to ground by a parallel combination of a resistor 146 and a capacitor 147 and collector electrode 143 is coupled to a source of operating potential by a resistor 148 and to base electrode 142 by a resistor 149. A capacitor 150 is coupled between collector electrode 143 and emitter electrode 141. A capacitor 151 is coupled between collector 143 and gate 111 of field effect transistor 110. A tuned resonant cavity 155 includes a resonant element 156 having one end connected to ground through a capacitor 157 and a second end connected to collector 143. A loop element 158 has one end connected to ground and movable with respect to resonant element 156. A capacitor 159 is connected between collector 143 and ground.

A transmission line element 160 is terminated on one end by the cathode of a varactor diode 161 having its anode connected to ground. The other end of transmission line 160 is coupled by a capacitor 162 to ground. An inductor 163 is coupled between a selected point on transmission line 160 and a source of DC tuning voltage (not shown) within phase locked loop 15. A parallel combination of a capacitor 164 and a resistor 165 is suitably coupled to ground at a point between the junction of inductor 165 and the source of DC tuning voltage in phase locked loop 15. A feed-through capacitor 166 is placed upon the connection between the junction of capacitor 164 and resistor 165 and ground to suppress parasitic signals.

A transistor 170 has an emitter electrode 171, a base electrode 172 and a collector electrode 173. Emitter 171 is coupled to ground by a resistor 174; base 172 is coupled to ground by a parallel combination of a resistor 175 and a capacitor 176 and to a source of operating potential by a resistor 177; and collector 173 is coupled to a source of operating potential through a ferrite head 178 and an inductor 179 and to emitter electrode 171 by a capacitor 180.

A transistor 190 has an emitter electrode 191, a base electrode 192 and a collector electrode 193. Emitter 191 is coupled to ground by a parallel combination of a resistor 194 and a capacitor 195; base 192 is coupled to ground by a resistor 196, to collector 173 through a capacitor 197. A series combination of resistors 198 and 199 is coupled between a source of operating potential and base 192. A transistor 210 has an emitter electrode 211, a base electrode 212 and a collector electrode 213. Emitter 211 is coupled to ground by a capacitor 214; base 192 is connected to the junction of resistors 198 and 199. Emitter 211 is also connected through a series arrangement of inductors 215 and 216 to emitter 193 of transistor 190. The junction of inductors 215 and 216 is connected by a capacitor 217 to base 212. A series combination of an inductor 194 and an inductor 198 is coupled between emitter 213 and a source of operating potential. A series combination of a capacitor 220 and a resistor 222 is coupled between the junction of inductors 218 and 219 and the center conductor of an output connector 223. A feed-through capacitor 224 is placed on the conductor between the source of operating potential and the common connection of resistor 199 and inductor 219.

A transformer 231 has a primary winding 232 having one end connected to the junction of capacitor 220 and resistor 222 and the other end connected to the anode electrode of diode 44, and a secondary winding 233 having one end connected to ground and the other end connected to the anode electrode of diode 46. A resistor 235 is connected between the center conductor of connector 223 and ground. The center conductor of connector 223 is coupled through divider 18 to phase locked loop 15.

In operation the tuned elements within filter 10 include a high pass section formed by inductors 21, 23 and 26 together with capacitors 22, 24 and 25 in which signals below 50 megahertz are attenuated. The remaining reactive elements of filter 10 comprise a series of low pass filter elements in which signals above 450 megahertz are attenuated. As a result the total effect of the high pass and low pass filter sections within filter 10 is to form a bandpass type filter in which signals between 50 megahertz and 450 megahertz are passed substantially unattenuated to bifilar transformer 40. Signals above 450 megahertz and lower than 50 megahertz are substantially attenuated. An additional effect of filter 10 is the prevention of the high frequency (i.e., always above 611 MHz) first local oscillator signal transmission "back" out to the input connection. The tuned signal output of filter 10 is coupled to a like polarity by bifilar transformer 40 to ring mixer 59 in a known "push-push" type coupling.

The regenerative stage formed by transistor 170 and associated components together with transmission line 160 which is tuned by varactor diode 161 produces an oscillator signal at collector 173 which is coupled via capacitor 197 to an amplifying stage 190, the output of transistor stage 190 is applied to a second gain tage 210 the output of which is applied to the primary of transformer 231 to an oscillator sample input terminal in phase locked loop 15. The operation of phase locked loop 15 is conventional in that the sampled oscillator output is compared to a frequency reference within phase locked loop 15 to produce a DC tuning voltage which is then applied via coil 163 to varactor diode 161. The DC tuning voltage conforms varactor diode 161 to provide an appropriate tuning capacitance for transmission line 160 and to set the frequency of oscillation of transistor 170 to provide the appropriate output signal.

The output of the successive gain stages formed by transistors 190 and 210 is also coupled by a balun transformer 231 to the same injection port of mixer 59 to which the filtered output signal from transformer 40 is applied. However, balun converter 231 provides a balanced oscillator input signal to mixer 59. The action of mixer 59 in response to a balanced injection of oscillator signal derived by first local oscillator 14 and the filtered input signal produces a frequency converted signal which is coupled by trifilar transformer 60 to the input of tuned cavity 70.

Tuned cavity 70 forms the first filter element of intermediate frequency filter 12 and provides bandpass frequency selection. The tuning of cavity 70 is controlled by variable capacitors 75 and 76. The filtered signal from cavity 70 is amplified by field effect transistor 80 and applied to a second tuned cavity 100. The construction and tuning of cavity 100 produces a double-tuned frequency characteristic signal in which the frequency selectivity of the 611 megahertz intermediate frequency signal is optimized to provide a 6 megahertz bandwidth appropriate to couple only the 611 megahertzs intermediate frequency signal and the associated modulated information to second mixer stage 13.

Second local oscillator 17 supplies second mixer 13 and includes a transistor 140 arranged in a known common base oscillator configuration. A tuned resonant circuit 155 formed by resonant element 156 and loop element 158 provides the necessary regenerative frequency selective element for the second local oscillator. Unlike the first local oscillator, second local oscillator 17 is at a fixed frequency and once the physical arrangement of resonant elements 156 and 158 within cavity 155 is established to provide the desired frequency no further adjustment of second local oscillator 17 is required. The oscillatory signals produced by the second local oscillator is applied together with the output of double tuned cavity 100 to a common gate of field effect transistor 110. The non-linear operation of field effect transistor 110 provides a second frequency conversion in which the selectivity of transformer 130 in the output of the field effect transistor stage maximally couples the frequency difference product to output connector 137 thereby completing the frequency down conversion in the second mixer.

Figure 3:
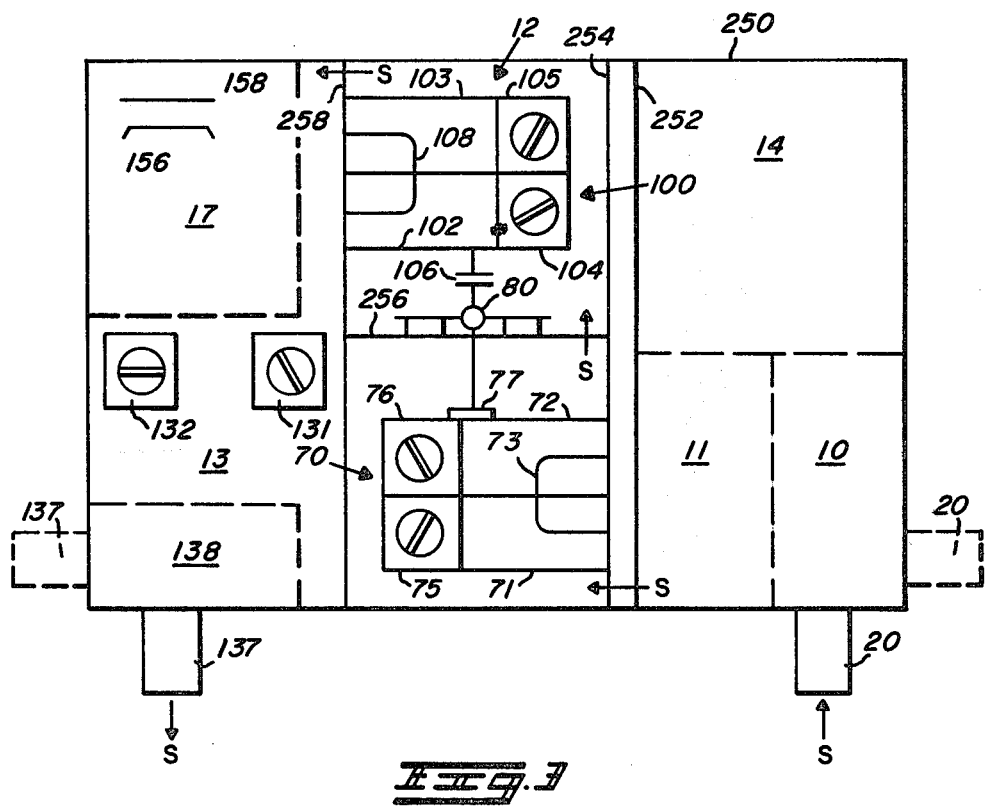
FIG. 3 is a top view of the tuner of the present invention having the top shield removed showing the signal processing path.

FIG. 3 shows generally the physical arrangement of the several portions of the CATV tuner of the present invention. The electrical interconnections are consistent with those shown in FIG. 2. The RF tuner design of the preferred embodiment comprises two local oscillators 14 and 17 positioned in a quadrilateral or generally rectangular structure. It is imperative that the local oscillators be kept electrically isolated so that neither oscillator will create undesirable frequency beats in the other signal mixer. The arrangement shown positions tuned cavity 12 between the local oscillator and their respective mixers. Tuned cavity 12 may be seen to comprise bandpass interstage circuit 70 and bandpass interstage circuit 100. Tuned cavity 12 functions as an input-output signal isolator.

In addition to keeping the local oscillators electrically isolated it is advantageous to have the input and output signals physically separated by as much distance as possible. To achieve this the input and output terminals 20 and 137 respectively are located at the corners separated by the longer rectangular dimension. Both input and output terminals are shown in phantom on adjacent corners to clearly indicate that the directions of signal input and output can be any of the four combinations of anti-parallel, parallel or at right angles.

Low pass input filter 10 is coupled to first mixer 11 which receives a signal from first local oscillator 14. The input signal is supplied through coaxial input 20. The direction for the input signal shown in FIG. 3 will form a reference direction for describing the signal path through the up-down frequency converter.

The processed signal from first mixer 11 is supplied to bandpass circuit 70 in a direction perpendicular with the input signal reference direction. The processed signal passes to bandpass circuit 100 through shield 256 via amplifier in a direction which is parallel to the input signal. The processed signal from bandpass circuit 100 is supplied to second mixer 13 in a direction which is perpendicular to the input signal. The finally processed signal exits the tuner in a direction anti-parallel to the original input signal direction.

The function of the two oscillators is to provide a double conversion to tune the input signal. Prior art tuners normally utilize a single oscillator circuit which operates with high side injection to cause tuning. But this results in the vestigial side-band signal being inverted and additional circuitry must be included to correct this situation. The advantage of double conversion is an improved range of tuning operation for the various components along with a double inversion of the vestigial side band. In the preferred embodiment the first conversion is to some convenient IF higher than the highest input frequency and the second conversion is to a convenient broadcast frequency lower than the first IF such as channel 3.

The advantage of the signal path through the converter may be seen from the fact that the various elements are RF isolated from each other. The entire tuner is enclosed by a shield 250 to which are normally attached top and bottom shields to completely isolate the tuner from spurious signals. These shields are planar and attach to the generally rectangular housing. In FIG. 3 the shields have been removed to show the signal path for the tuner. Input filter 10, first mixer 11 and first local oscillator 14 are isolated from tuned cavity 12 by a pair of RF wall-type shields 252 and 254.

Tuned cavity 12 is similarly isolated from second mixer 13 and second local oscillator 17, and output circuit 138 by RF wall-type shield 258. This insures that no spurious signals from either local oscillator can affect the mixer of the other. Coaxial input terminal 20 and coaxial output terminal 137 are each connected to shield 250.

The significance of the positioning of the input and output terminals on the longer side of a quadrilateral and generally rectangular structure and the positioning of corresponding low pass input filter and output circuit substantially in the corners of the quadrilateral or generally rectangular package can only be appreciated with the knowledge of the disruptive effect of the physical location of components in RF circuits. Having the ability to modify radically the input and output signal directions without the expense of redesigning the entire converter is a considerable advantage.

Moreover if the alternative input and output positions (shown in phantom) are not utilized for various changes in signal directions they can then provide electrical terminals to draw or siphon off a small portion of the input or output signal to provide additional control functions for a CATV system. As for example a portion of the input signal might be drawn off and supplied to a local signal decoder to provide recognition of a signal permitting frequency conversion of an otherwise restricted channel. Similarly a portion of the output signal from the converter could be utilized to provide a signal for communicating a variety of information back to a central location such as identification of the currently tuned frequency to the CATV system.

It will be appreciated that the combination of double conversion and the described signal path provide a simple and economical, yet high performance design of a CATV tuner. Each local oscillator is separated from the others mixer by a triple wall shield and through a series of bandpass circuits contained in tuned cavity 12 which physically separates the local oscillators. As is the case for all RF circuitry, the physical arrangement of the tuner components is critical to its performance. The input and output circuits are located at respective corners of a quadrilateral or generally rectangular package to allow for a combination of input and output directions and to provide electrical connections to draw off a portion of either signal to provide power to or control of other portions of the CATV system.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. An up-down dual conversion frequency converter for converting selected ones of a plurality of received cable television signals to a predetermined broadcast frequency for display by a television receiver comprising:

a substantially quadrilateral electrically conductive housing enclosed on the top and bottom by generally planar electrically conductive shields;

first and second local oscillators located in said housing, said first local oscillator being tunable to produce frequencies above the frequency of said cable television signals and said second local oscillator being fixed to a frequency less than the frequency of said first oscillator;

first and second mixers located in said housing and coupled respectively to said first and second local oscillators;

a signal input circuit in said housing coupled to said first mixer, positioned adjacent a first corner of said housing and receiving said plurality of cable television signals;

an output signal circuit in said housing coupled to said second mixer, positioned adjacent a second corner of said housing and providing said predetermined broadcast frequency; and a pair of electrically shielded tuned cavities coupled between said first and second mixers to electrically isolate said input signal circuit, first oscillator and first mixer from said output signal circuit, second oscillator and second mixer, a signal input terminal and a signal output terminal respectively coupled to said input and output circuits and respectively located adjacent said first and second housing corners, said terminals being alternatively locatable on either one of a respective pair of housing sides adjacent said respective first and second corners without performance degradation of said frequency converter.

2. The frequency converter of claim 1 further including means for drawing off a portion of said input cable television signals for further processing.

3. The frequency converter of claim 2 further including means for drawing off a portion of said output broadcast frequency signal and coupling to the cable television system.

4. The frequency converter of claim 3 further including wall-like shielding means extending between said planar shields, positioned adjacent said tuned cavity and providing additional isolation between said oscillators.

5. The frequency converter of claim 4 wherein said wall-like shield means positioned between said tuned cavity and said first oscillator further comprises an independent double wall parallel configuration.

\* \* \* \* \*